US009404957B2

(12) United States Patent
Chen et al.

(10) Patent No.: US 9,404,957 B2
(45) Date of Patent: Aug. 2, 2016

(54) FAULT DIAGNOSIS AND PRELIMINARY LOCATION SYSTEM AND METHOD FOR TRANSFORMER CORE LOOSENESS

(75) Inventors: Kai Chen, Nanjing (CN); Chunning Wang, Nanjing (CN); Hongzhong Ma, Nanjing (CN); Kai Li, Nanjing (CN); Yiming Wu, Nanjing (CN); Ying Zhang, Nanjing (CN); Hongtao Liu, Nanjing (CN); Peng Gao, Nanjing (CN); Taotao Chen, Nanjing (CN)

(73) Assignees: JIANGSU NANJING POWER SUPPLY COMPANY, Nanjing (CN); STATE GRID CORPORATION OF CHINA, Nanjing (CN); HOHAI UNIVERSITY, JIANGSU ELECTRIC POWER COMPANY, Nanjing (CN)

( * ) Notice: Subject to any disclaimer, the term of this patent is extended or adjusted under 35 U.S.C. 154(b) by 188 days.

(21) Appl. No.: 14/128,603

(22) PCT Filed: Jul. 19, 2012

(86) PCT No.: PCT/CN2012/078885
§ 371 (c)(1),
(2), (4) Date: Dec. 21, 2013

(87) PCT Pub. No.: WO2013/185405
PCT Pub. Date: Dec. 19, 2013

(65) Prior Publication Data
US 2014/0118003 A1    May 1, 2014

(30) Foreign Application Priority Data

Jun. 13, 2012    (CN) .......................... 2012 1 0193931

(51) Int. Cl.
*G01R 31/02*    (2006.01)
*G01H 1/00*    (2006.01)

(52) U.S. Cl.
CPC ................ *G01R 31/027* (2013.01); *G01H 1/00* (2013.01)

(58) Field of Classification Search
None
See application file for complete search history.

(56) References Cited

U.S. PATENT DOCUMENTS 3,449,633 A * 6/1969 Schroeder ............. H01F 27/402
340/646
6,178,386 B1 * 1/2001 Shertukde .............. G01N 29/14
336/145

(Continued)

FOREIGN PATENT DOCUMENTS

CN    101769787 A * 7/2010
CN    101782426 A * 7/2010

(Continued)

*Primary Examiner* — Jermele M Hollington
*Assistant Examiner* — Douglas X Rodriguez
(74) *Attorney, Agent, or Firm* — Treasure IP Group, LLC (57) ABSTRACT

This invention publishes a fault diagnosis and location system for transformer core looseness, consists of vibration sensors, data collection and computer. It is of power transformer fault intelligent diagnosis technology technical field. Fault diagnosis and location method uses three vibration sensors positioned on the top of transformer tank, to obtain vibration signal, uses signal processing to analyze the signal, and obtains fault characteristics of the transformer core looseness. The characteristics respectively are 50 Hz, 150 Hz and 300 Hz frequency components, in which 300 Hz is main feature. When they reach a certain value at one position, it suggests that transformer core looseness near this position. By the comparison of differences among signals of three positions, fault location can be done. This invention manifests fault characteristics accurately and detects core looseness efficiently.
The invention uses the electricity grid frequency of 50 Hz for example, for 60 Hz power system, above 50 Hz, 150 Hz, 300 Hz characteristic frequencies are 60 Hz, 180 Hz and 360 Hz.

3 Claims, 7 Drawing Sheets

(56) References Cited

U.S. PATENT DOCUMENTS

| | | | |
|---|---|---|---|
| 7,539,549 B1 * | 5/2009 | Discenzo | F04D 15/0077 324/765.01 |
| 8,849,587 B1 * | 9/2014 | Lightle | G01R 31/027 340/646 |
| 2005/0040809 A1 * | 2/2005 | Uber, III | G01R 15/142 324/117 R |
| 2006/0259271 A1 * | 11/2006 | House | G05B 23/0248 702/181 |
| 2010/0102976 A1 * | 4/2010 | Lee | G01H 1/003 340/646 |
| 2012/0130663 A1 * | 5/2012 | Madhukar | G01R 31/027 702/65 |
| 2012/0206630 A1 * | 8/2012 | Nguyen | H04N 1/409 348/241 |
| 2012/0327745 A1 * | 12/2012 | Yardibi | G01S 3/80 367/121 |

FOREIGN PATENT DOCUMENTS

| | | | |
|---|---|---|---|
| CN | 102331547 A | * | 1/2012 |
| CN | 102375102 A | * | 3/2012 |

* cited by examiner

Normal condition
Position No.3 at 380V (a)

Core looseness
Position No.3 at 380V (b)

FIG.9

FAULT DIAGNOSIS AND PRELIMINARY LOCATION SYSTEM AND METHOD FOR TRANSFORMER CORE LOOSENESS

TECHNICAL FIELD

The present invention relates to a technology of online condition monitoring of power transmission and transformation equipment, specifically relates to a fault diagnosis and location system for transformer core looseness. It is an intelligent substation technology.

BACKGROUND

Figure 1:
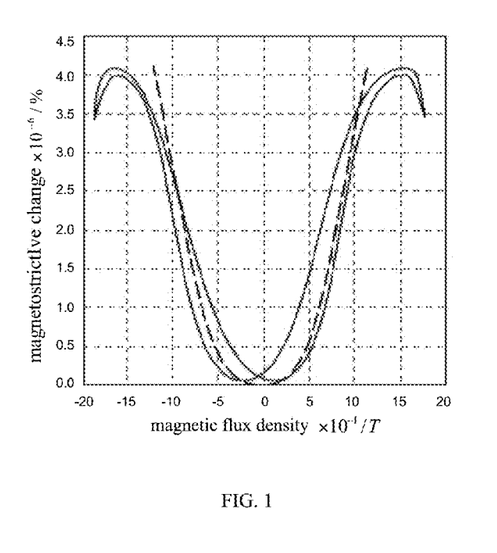
FIG. 1 is iron core magnetostrictive changes with magnetic flux density of the present invention.

The main reasons causing the transformer tank vibration are vibration from the transformer body and cooling system installations. The fundamental vibration frequency caused by the cooling device is low, and is significantly different to from the transformer body vibration; transformer body vibration includes core and winding vibration. During operation, the current in windings produces electromagnetic field in both core and winding; core silicon steel materials in the magnetic field have magnetostriction, namely the size of the atom has a small deformation, causing the core vibration. The solid line in FIG. 1 describes the relationship between the magnetostrictive deformation and core flux density. To simplify, use the quadratic curve, namely the dashed line. It can be seen that the magnetostrictive deformation is a linear relationship with the square of the size of the magnetic flux density. The relationship between the load voltage and magnetic flux density is:

$$B = \frac{\Phi}{A} = \frac{\sqrt{2}\,U}{2\pi f N A}$$

Where $\psi$ and $B$ are main flux and magnetic flux density, respectively; $A$ is cross-sectional area of the core; $U$ is load voltage; $f$ is the frequency of load voltage; $N$ is the number of turns of primary winding.

In FIG. 1, core vibration $v_{core}$ caused by the magnetostriction is approximately proportional to the square of load voltage:

$$v_{core} \propto U^2;$$

As the duplation frequency of voltage is 100 Hz, the fundamental frequency of magnetostriction is 100 Hz.

Core is made from silicon steel, each piece of silicon steel surface is insulating coated, so there is a gap between segments, resulting in magnetic flux leakage, cause core and tank vibration. But the vibration can be ignored because it is much smaller than the vibration caused by magnetostriction. So the core vibration depends on the magnetostriction of silicon steel, the core vibration fundamental frequency is 100 Hz. Because of the nonlinear magnetostrictive and different magnetic circuit length of core inside and outside the box, the core vibration, in addition to the fundamental frequency, also contains the harmonic components, which are integer multiple of the fundamental frequency component.

The vibration of the winding is caused by electric power. Under the influence of the leakage inductance, current in winding interacts to generate electric force, which is proportional to the square of the current. Winding current is zero on no-load condition, so winding vibration now has no influence on core vibration. The vibration of the no-load transformer depends on the core.

According to above analysis, no-load tank vibration is related to core magnetostriction, namely related to voltage. Transformer vibration transmits to tank via transformer oil and solid structures. Be influenced by various factors, vibration signal changes in amplitude and phase. When it reaches the tank surface, it becomes complex.

After the loosening of the core, the magnetic flux leakage between the silicon steel joints and laminations become larger, resulting in larger electromagnetic attractive force, larger core vibration.

Figure 2:
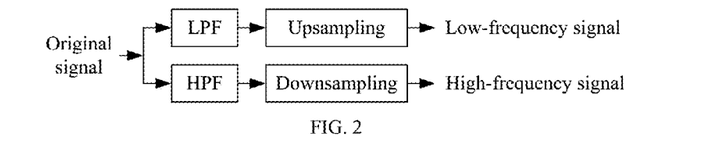
FIG. 2 is schematic diagram of the wavelet de-noising of the present invention.

The transformer vibration signal is non-stationary signals. Signal processing methods include Fourier transform, wavelet transform, Hilbert Huang Transform. The Fourier transform is the most classic signal processing methods. It is suitable for stationary signals, to transform time domain of the signals to frequency domain, is widely used in engineering. Wavelet de-noising principle is shown in FIG. 2, the high-frequency signal can be filtered by the signal decomposition and reconstruction, reorganize low-frequency signal to the filtering effect.

SUMMARY OF THE INVENTION

One embodiment of the present invention is a system and method for fault diagnosis and preliminary location determination for transformer core looseness, said system have at least three vibration sensors, a conversion interface, a data collection module and a data analysis module, wherein said three vibration sensors collect transformer vibration signals with a set sampling frequency and time, then the transformer vibration signals are delivered to said data collection module via the conversion interface. The three vibration sensors are fixed on three positions of a power transformer tank top surface, corresponding to the three-phase winding positions of the power transformer tank. Said data collection module is used to sample and record transformer vibration signals from the three vibration sensors, then deliver to a data analysis module. Said data analysis module stores and analyzes data and diagnoses a fault, finally outputs a result.

The present invention provides a data analysis module including a wavelet de-noising unit, Fourier transform unit, data storage unit, calculating unit and output unit.

Wherein said wavelet de-noising unit de-noises the transformer vibration signals from the data collection module.

Then said Fourier transform unit does a Fourier transform to de-noise the transformer vibration signals, and to get a spectrum.

Said data storage unit stores $TH_1$, $TH_2$, $CR_1$ and $CR_2$, wherein $TH_1$ is a threshold at 300 Hz of the spectrum of the transformer vibration signals, $TH_2$ is a combined threshold at 50 Hz and 150 Hz of the spectrum of the transformer vibration signals.

Said calculating unit compares the amplitude at 300 Hz of the spectrum with $TH_1$. Signal samples are collected for at least 3 times at one same condition. When the samplings on the amplitude at 300 Hz are greater than $TH_1$ at least 2 times, then calculate a combined amplitude at 50 Hz and 150 Hz of the spectrum, compare it with $TH_2$; When the sample of the combined amplitude at 50 Hz and 150 Hz is greater than $TH_2$ for at least 2 times, then it is concluded that there is core looseness near the sensor position. Output a result to an output unit.

The present invention also provides a test method for said fault diagnosis and preliminary location determination for transformer core looseness:

Steps are shown as the following on a no-load power transformer under a normal condition:

(1) According to a default sampling frequency and sampling time, use the three transformer vibration sensors recited above, to collect transformer vibration signals, sample for at least three times at one same condition;

(2) Among transformer vibration signals from all sensors, obtain transformer vibration signals covering complete cycles by collecting transfer vibration data at different sampling frequency, sampling time or sampling number;

(3) Use a wavelet to de-noise transformer vibration signals obtained from step (2), perform a Fourier transform, then get spectrum values at 50 Hz, 150 Hz and 300 Hz;

(4) Calculate the amplitude at 300 Hz of the spectrum, multiply by a certain magnification, as the value of $TH_1$; calculate the combined amplitude at 50 Hz and 150 Hz, multiply by the certain magnification, and set as the value of $TH_2$; wherein said certain magnification generally is from 1.2 to 2.5.

Steps are shown as the following, when the transformer is under a no-load stable operating condition, in order to diagnose a fault:

(5) Repeat step (1) to step (3), sample the transformer vibration signals and process the data, to get the amplitudes at 50 Hz, 150 Hz, and 300 Hz of the spectrums;

(6) Take the amplitude at 300 Hz of the spectrum as $CR_1$. If at least two continuous $CR_1$ are greater than $TH_1$, then continue to step (7), otherwise go back to step (5);

(7) Calculate a combined amplitude at 50 Hz and 150 Hz of the spectrum, take it as $CR_2$. Compare it with $TH_2$. If for at least 2 times the sampled data $CR_2$ is greater than $TH_2$, then it is concluded that there is core looseness near the sampling position. Output a result to an output unit, otherwise go back to step (5).

Comparing with the present technology, the present invention has these advantages:

Experiments have shown that the selected features in the present invention can accurately reflect the fault characteristics of core looseness, and effectively detect core looseness of power transformer. Comparison of signal characteristic at three different positions can suggest a fault location preliminarily.

BRIEF DESCRIPTION OF DRAWINGS

FIG. 6 (a) is the original vibration signal from the data collection of the embodiment of the present invention;

FIG. 6 (b) is the de-noised signal of the embodiment of the present invention;

FIG. 7 (a) is the vibration signal spectrum of fault point at normal condition of the embodiment of the present invention;

FIG. 7 (b) is the vibration signal spectrum of fault point at fault condition of the embodiment of the present invention;

DESCRIPTION OF EMBODIMENTS

Figure 3:
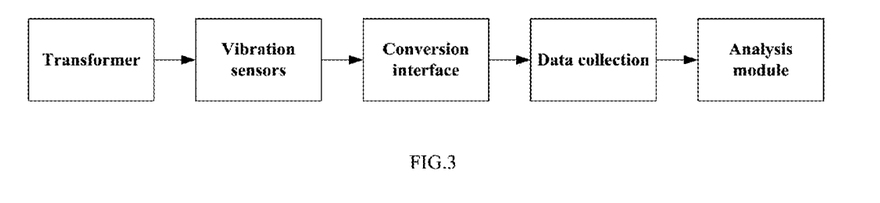
FIG. 3 is the diagnosis system block diagram of the present invention.
Figure 4:
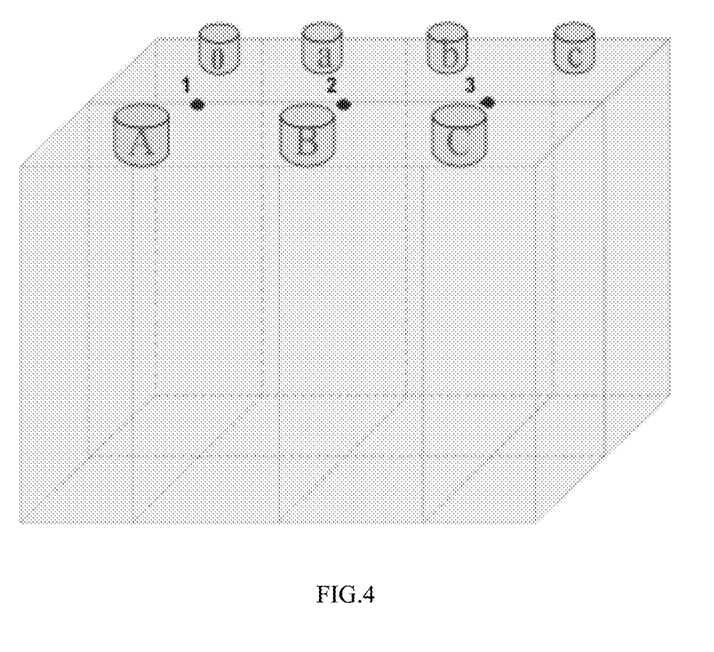
FIG. 4 is the sensors fixed position of the diagnosis system of the present invention.

The following offers further details of the embodiments of the present invention:

As FIG. 3 shows, the present invention provides a fault diagnosis and location determination system for transformer core looseness, which consists of a transformer, vibration sensors, a conversion interface, a data collection module and analysis module. Wherein, input sides of the vibration sensors are firmly fixed at positions corresponding to three phases on the surface of a transformer tank via magnets. As FIG. 4 shows, A, B, and C represent three phases of high voltage sides, respectively; a, b, and c represent three phases of low voltage sides, respectively; 0 represents the zero line of the transformer; 1, 2, and 3 represent three measuring positions of the vibration sensors on the top of the transformer tank. The output side of the vibration sensors is linked to an input side of the data collection module via a conversion interface. An output side of the data collection module is linked to the analysis module via a network line interface.

Figure 5:
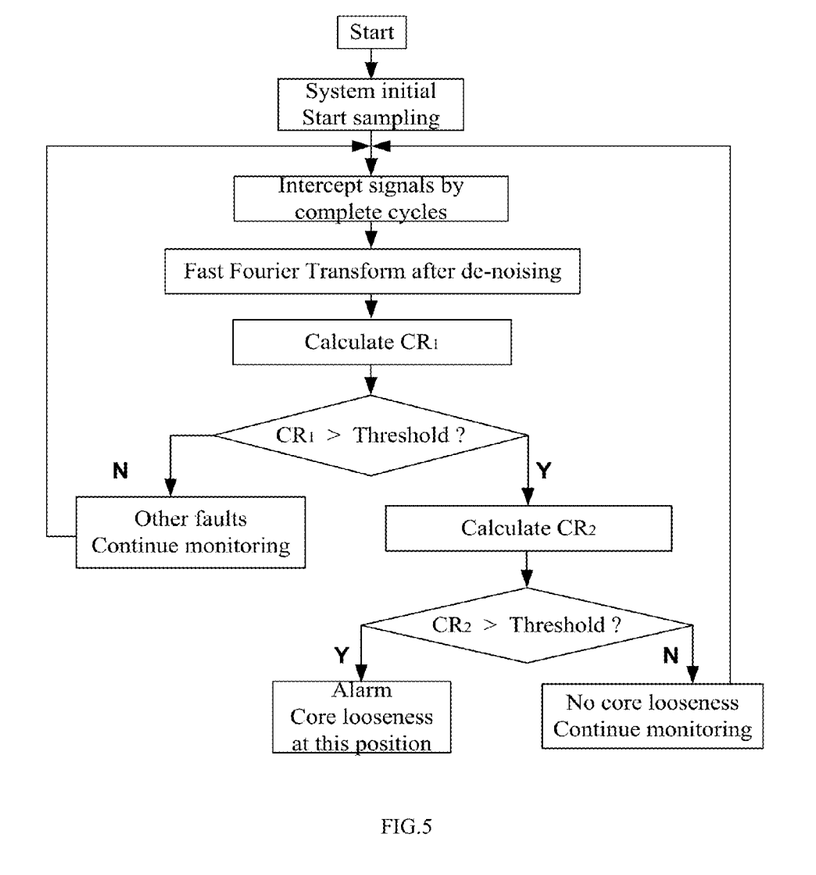
FIG. 5 is the flow chart of the diagnosis method of the present invention.

FIG. 5 is the flow chart of a method of the fault diagnosis and location determination for transformer core looseness of the present invention, including the following steps:

(1) According to a default sampling frequency and sampling time, collect transformer vibration signals under a stable operating condition, and sample for at least three times at one same condition;

(2) Among vibration signals from all sensors, obtain transformer vibration signals covering complete cycles according to sampling frequency, sampling time or sampling number;

(3) Use a wavelet to de-noise the transformer vibration signals signal from step (2), then perform a Fourier transform;

(4) Calculate the amplitudes at 50 Hz, 150 Hz and 300 Hz of the spectrum;

(5) Take the amplitude 300 Hz of the spectrum, multiply by a certain magnification, and set as the value of $TH_1$; take the combined amplitude at 50 Hz and 150 Hz, multiply by the certain magnification, and set as the value of $TH_2$; wherein said certain magnification generally is from 1.2 to 2.5.

Collect vibration signals of an operating transformer under a normal condition, calculate $TH_1$, and $TH_2$, and take them as the threshold values.

Use vibration sensors to sample the transformer vibration signals, process the vibration signals as said in step (3), and collect the amplitude data at 50 Hz, 150 Hz, and 300 Hz.

(6) Take the amplitude at 300 Hz of the spectrum as $CR_1$. Sample for at least 3 times under the same conditon. If for at least 2 times the sampled data of $CR_1$ is greater than $TH_1$, then continue to step (7), otherwise repeat step (1)~step (4), continue sampling, and then go to step (6);

(7) Calculate a combined amplitude at 50 Hz and 150 Hz of the spectrum, take it as $CR_2$. Compare $CR_2$ with $TH_2$. If for at least 2 times the sampled data $CR_2$ is greater than $TH_2$, then it is concluded that there is core looseness near the sample position. Output a result to an output unit, otherwise repeat steps (1)~(4), continue sampling, and then go to step (6);

EXAMPLES

In order to verify the correctness of the present invention, a system to determine core looseness in the present invention is placed on a test transformer and the steps described above are followed to do an experiment. The transformer is made by the Jiangsu Hongyuan Electrical Co., Ltd., and its parameters are shown in Tab.1.

TABLE 1

| Type | Voltage ratio | Connection Group |
|---|---|---|
| S9-M-100/10 | 10/0.4 kV | Yyn0 |
| High-voltage side $I_N$ 5.77A | Ligh-voltage side $I_N$ 144.3A | Short-circuit impedance 3.98% |

(A) System Connection

In FIG. 3, the type of transformer is S9-M-100/10, the type of vibration sensor is CA-YD-103, BNC interface is used as a conversion interface, the type of data collection module is Nicolet7700, and a computer is used as an analysis module. The s input sides of the sensors are firmly fixed at the positions corresponding to three phases on the surface of the transformer tank via magnets. The output sides of the sensors are linked to the input side of the data collection module via the conversion interface. The output side of the data collection module is linked to the analysis module via a network line interface.

(B) The Installation of Sensors

Use CA-YD-103 as the vibration sensors, the parameters are shown in Tab.2.

TABLE 2

| Axial sensitivity | Maximum transverse sensitivity | Ballistic limit | Frequency response |
|---|---|---|---|
| 20 pC/g | <5% | 2000 g | 0.5~12 kHz |

In order to fully measure the vibration signals of the transformer core, the experiment is done as much as possible under a no-load condition; three vibration sensors are installed at three positions on the top of the transformer. Specific installation location is shown in FIG. 4.

(C) The Setting of Core Looseness

Sling the transformer core with a crane. Use a wrench to loose core fastening screw for about 1 cm. Beat the loosen side with a mallet, and then put a bamboo gently to the gap of the core silicon steel to further loosen the core.

(D) Test Example

Prepare a Nicolet data collection module by charging the amplifier inside. Nicolet data collection module is used to sample and record vibration signals collected by the vibration sensors, and the computer is used to store and process the signal data, diagnose the fault and output the results.

Figure 6:
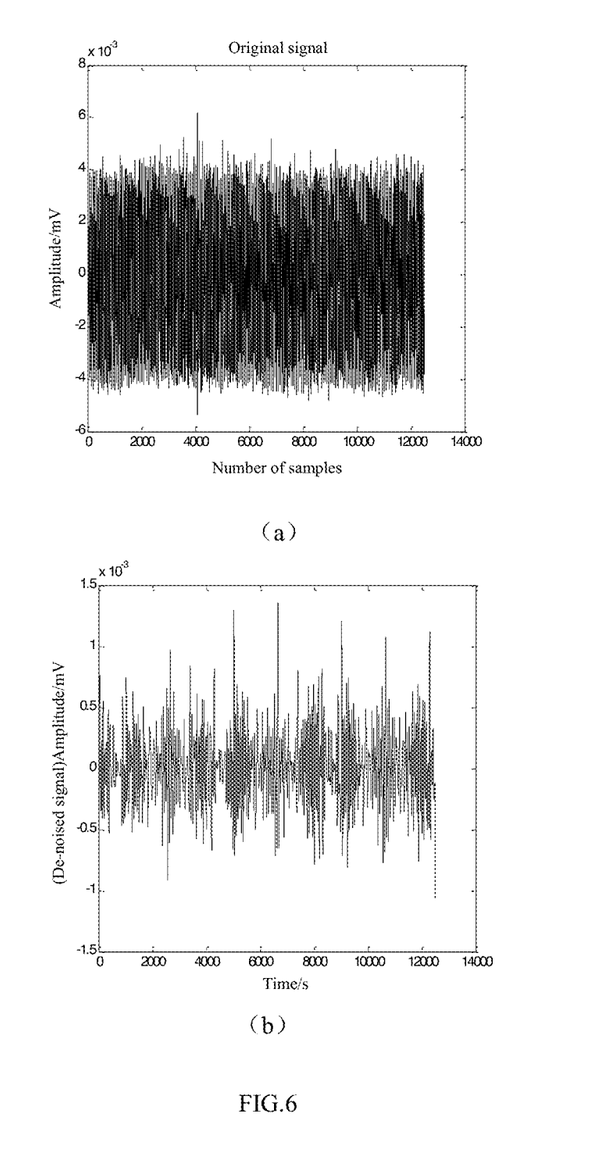

In this example, test as the steps described above, obtain vibration signals and de-noise the signals with a wavelet method. FIG. 6 (a) and FIG. 6 (b) show the vibration signals before and after de-noising. The two drawings show the effect of de-noising.

Figure 7:
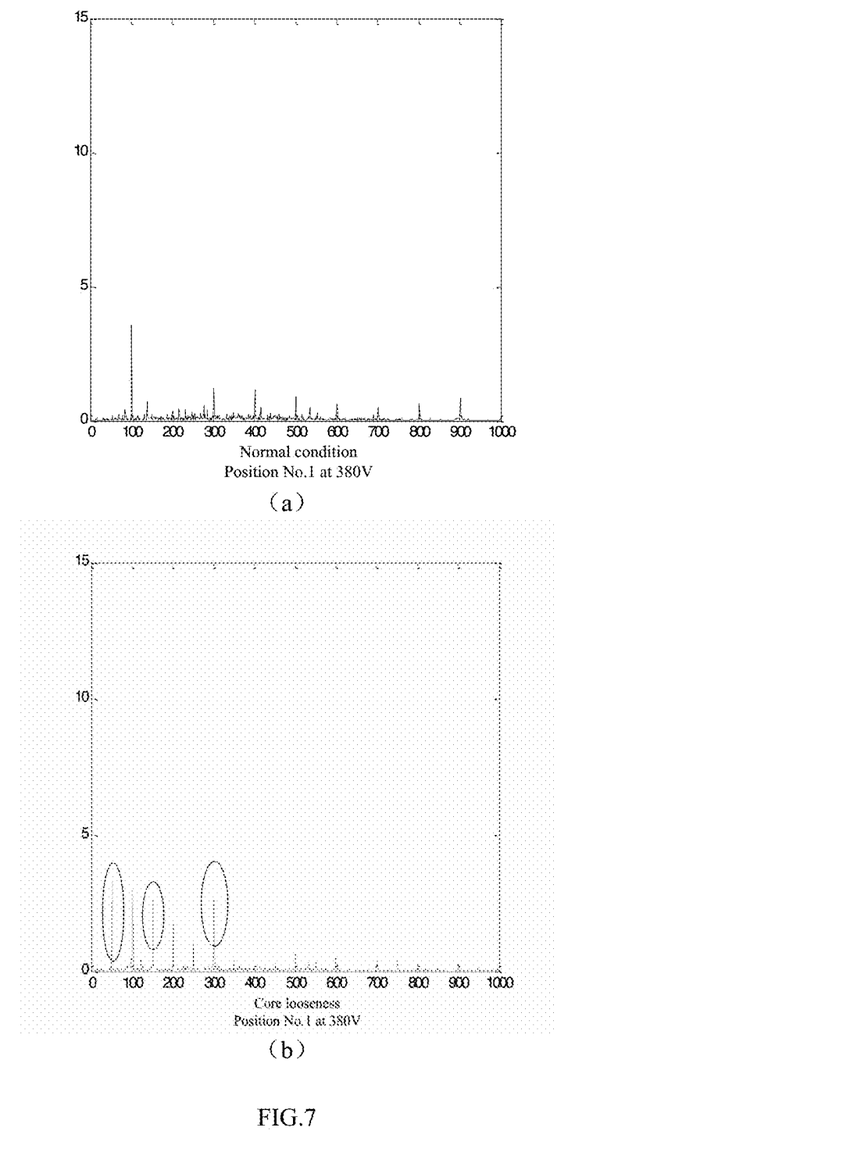

FIG. 7 (a) and FIG. 7 (b) show the spectrum of position 1#, (namely near fault position). Compare spectrums under normal and fault conditions, it can be seen that after looseness has occurred, more 50 Hz harmonic components are produced, and the energy at 300 Hz arises.

When the core is loosened from the tank surface, vibrations will produce more 50 Hz harmonic components, and energy at 300 Hz rises.

After calculation, amplitude ratio at different frequencies is shown in Tab. 3.

TABLE 3

| Amplitude of 1# on no-load condition | normal/normal | looseness/normal |
|---|---|---|
| (50 + 150) Hz | 1 | 14.8 |
| 300 Hz | 1 | 3.93 |

Use a Fourier transform, take 300 Hz ($CR_1$) as the main characteristic. When the value of $CR_1$ reaches a certain point, it suggests that transformer core looseness occurs near this position. When the combined value at 50 Hz and 150 Hz ($CR_2$) reaches a certain point, it is further determined that there is core looseness near the position.

Figure 8:
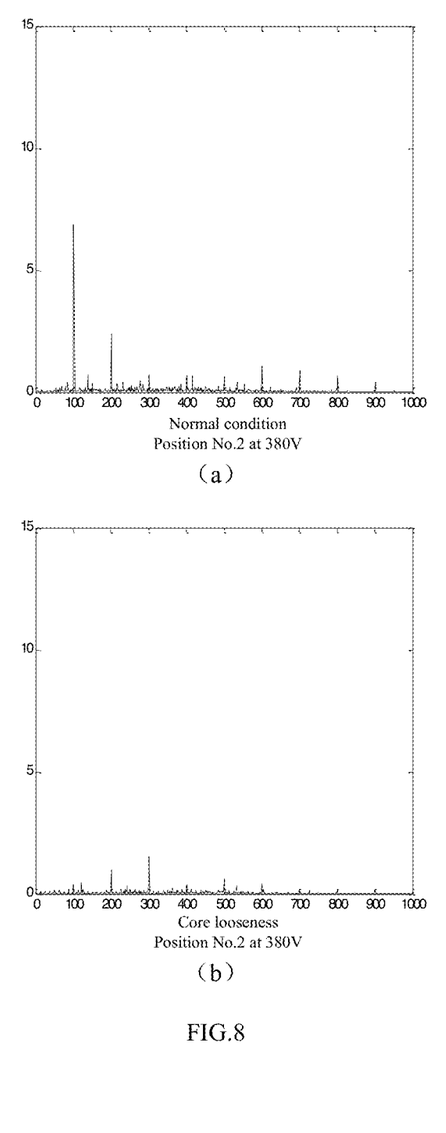
FIG. 8(a) is the vibration signal spectrum of non-fault point 1 at normal condition of the embodiment of the present invention.
FIG. 8(b) is the vibration signal spectrum of non-fault point 1 at fault condition of the embodiment of the present invention.

FIG. 8 (a) and FIG. 8 (b) show the spectra of position 2#, (namely non-fault position), before and after the fault setting, respectively. It can be seen, there is no fault characteristic as at 1#.

Figure 9:
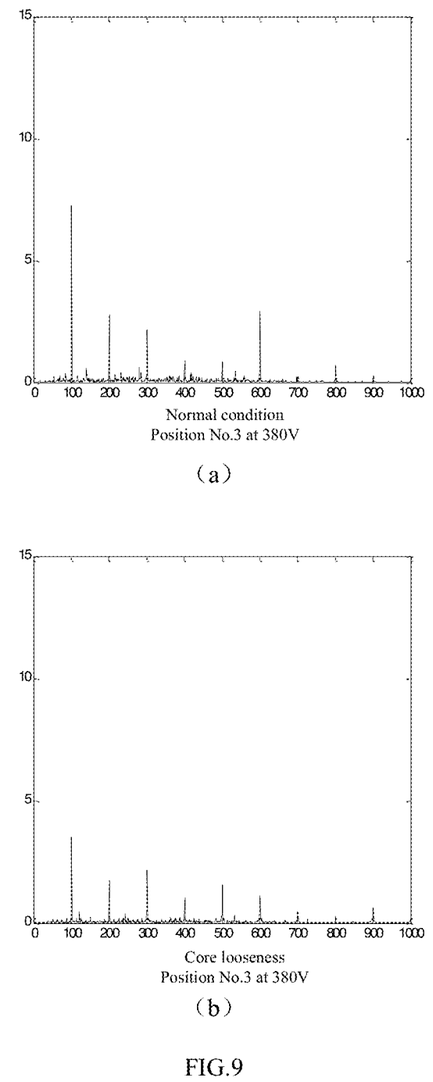
FIG. 9(a) is the vibration signal spectrum of non-fault point 2 at normal condition of the embodiment of the present invention.
FIG. 9(b) is the vibration signal spectrum of non-fault point 2 at fault condition of the embodiment of the present invention.

FIG. 9 (a) and FIG. 9 (b) show the spectra of position 3#, (namely non-fault position), before and after the fault setting, respectively. It can be seen, there is no fault characteristic as at 1#.

On the basis of theoretical analysis, with a large number of experiments, it is proved that the above characteristics are with good reproducibility and regularity, and it is determined that this feature can be used in the transformer core looseness fault diagnosis.

Finally, it should be noted, that the above embodiments are only used to describe the technical solution of the present invention rather than to limit this technique, the present invention can be extended its application to other modifications, changes, applications and embodiments, and therefore all of such modify, change, application, embodiments are included in the spirit and teachings of the present invention.

The invention uses the electricity grid frequency of 50 Hz for example, for 60 Hz power system, above 50 Hz, 150 Hz, 300 Hz characteristic frequencies are 60 Hz, 180 Hz and 360 Hz.

We claim:
1. A method, comprising
providing at least three vibration sensors, a conversion interface, a data collection module and a data analysis module;
collecting transformer vibration signals with a set sampling frequency and time by using the three vibration sensors;
then delivering the vibration signals to said data collection module via a conversion interface;
detecting a loosening core in a transformer and locating an initial position of the loosening core;
wherein the three vibration sensors are fixed on three positions of a power transformer tank top surface, and the three positions on the top surface correspond to the three-phase winding positions of the power transformer tank;
wherein said data collection module is used to sample and record transformer vibration signals from the three vibration sensors, then deliver to a data analysis module; and wherein the data analysis module stores and analyzes data and diagnoses a fault, finally outputs a result.

2. The method of claim 1, wherein said data analysis module consists of a wavelet de-noising processing unit, a Fourier transform unit, a data storage unit, a calculation unit and an output unit, wherein said wavelet de-noising unit de-noises the transformer vibration signals from the data collection module, then said Fourier transform unit does Fourier transform to de-noise signals, and to get a spectrum, said data storage unit stores $TH_1$, $TH_2$, $CR_1$ and $CR_2$, wherein $TH_1$ is a threshold at 300 Hz of the spectrum of the transformer vibration signals;

$TH_2$ is the combined threshold at 50 Hz and 150 Hz of the spectrum of the transformer vibration signals;

$CR_1$ is the amplitude at 300 Hz of the spectrum; and $CR_2$ is the calculated combined amplitude at 50 Hz and 150 Hz of the spectrum; and wherein said calculating unit compares the amplitude at 300 Hz of the spectrum ($CR_1$) with $TH_1$ after taking signal samples at a same condition for at least three times, calculates the combined amplitude at 50 Hz and 150 Hz of the spectrum and compare it with $TH_2$ after the combined amplitude at 50 Hz and 150 Hz is larger than $TH_2$ for at least twice, and determines a core looseness and outputs a result to the output unit.

3. A method of claim 1, further comprising performing the following steps when the transformer is on a no-load power state at a normal condition:

(1) using the three vibration sensors said in claim 1 to collect transformer vibration signals and sample at least three times at the same condition, according to a default sampling frequency and sampling time;

(2) obtaining transformer vibration signals covering complete cycles by collecting transfer vibration data at different sampling frequency, sampling time or sampling number from all transformer vibration sensors;

(3) using a wavelet to de-noise transformer vibration signals obtained from step (2), performing signal processing, and then getting spectrum values at 50 Hz, 150 Hz and 300 Hz;

(4) calculating an amplitude of 300 Hz of the spectrum, multiply by a certain magnification, and setting as the value of $TH_1$; calculating an combined amplitude at 50 Hz and of 150 Hz of the spectrum, multiply by the certain magnification, as the value of $TH_2$; wherein said certain magnification is from 1.2 to 2.5, performing the following steps when the transformer is on a no-load stable operating condition to diagnose a fault:

(5) repeating step (1) to step (3), sampling the transformer vibration signals and processing the data, to get the amplitudes at 50 Hz, 150 Hz, and 300 Hz of the spectrum;

(6) taking the amplitude at 300 Hz of the spectrum as CR1, when at least two consecutive $CR_1$ is greater than $TH_1$, continue to step (7), otherwise going back to step (5);

(7) calculating a combined amplitude at 50 Hz and 150 Hz of the spectrum as $CR_2$ comparing $CR_2$ with $TH_2$, if $CR_2$ is greater than $TH_2$ for at least twice, and determining core looseness position, and outputting a result to the output unit, or otherwise go back to step (5), wherein the characteristic frequencies of 50 Hz, 150 Hz, and 300 Hz are used for the electricity grid frequency of 50 Hz, but for a 60 Hz power system, and the characteristic frequencies are 60 Hz, 180 Hz and 360 Hz.

* * * * *